(12) United States Patent
Sundaram et al.

(10) Patent No.: US 8,578,696 B2
(45) Date of Patent: Nov. 12, 2013

(54) TURBULATED ARRANGEMENT OF THERMOELECTRIC ELEMENTS FOR UTILIZING WASTE HEAT GENERATED FROM TURBINE ENGINE

(75) Inventors: Hariharan Sundaram, Bangalore (IN); Mayur Abhay Keny, Bangalore (IN); Kathleen Blanche Morey, Scotia, NY (US)

(73) Assignee: General Electric Company, Schenectady, NY (US)

( * ) Notice: Subject to any disclaimer, the term of this patent is extended or adjusted under 35 U.S.C. 154(b) by 615 days.

(21) Appl. No.: 12/849,517

(22) Filed: Aug. 3, 2010

(65) Prior Publication Data

US 2012/0031067 A1 Feb. 9, 2012

(51) Int. Cl.
*F02C 7/08* (2006.01)
*F02G 1/00* (2006.01)
*F02G 3/00* (2006.01)

(52) U.S. Cl.
USPC .......................................... 60/39.5

(58) Field of Classification Search
USPC ................................ 136/200–242
See application file for complete search history.

(56) References Cited

U.S. PATENT DOCUMENTS

| | | | |
|---|---|---|---|
| 4,477,686 A * | 10/1984 | Nakajima et al. ............. | 136/203 |
| 5,738,493 A | 4/1998 | Lee et al. | |
| 7,100,369 B2 | 9/2006 | Yamaguchi et al. | |
| 2004/0045594 A1 | 3/2004 | Hightower | |
| 2005/0172993 A1 | 8/2005 | Shimoji et al. | |
| 2005/0268955 A1 | 12/2005 | Meyerkord et al. | |
| 2009/0159110 A1* | 6/2009 | Kwok et al. ................. | 136/205 |

FOREIGN PATENT DOCUMENTS

| | | | |
|---|---|---|---|
| JP | 2001342848 A | | 12/2001 |
| JP | 2002199761 A | | 7/2002 |
| JP | 2009117169 A | | 5/2009 |
| RU | 2191447 C2 | | 10/2002 |
| RU | 2280768 C1 | | 7/2006 |
| WO | 0161768 A1 | | 8/2001 |

OTHER PUBLICATIONS

Lon E. Bell, "Cooling, Heating, Generating Power, and Recovering Waste Heat with Thermoelectric Systems" Science, Sep. 2008, vol. 321, 1457-1478.*
Kushch et al., "The Effects of an Exhaust Thermoelectric Generator of a GM Sierra Pickup Truck," Aug. 29-Sep. 2, 2004, 21 pages, 2004 Deer Conference, Coronado, CA.
Rowe et al., "Evaluation of thermoelectric modules for power generation," Nov. 5, 1997, pp. 193-198, Journal of Power Sources 73 (1998), 1998 Elsevier Science S.A.
Glosch et al., "A thermoelectric converter for energy supply," 1999, pp. 246-250, Sensors and Actuators 74 (1999), 1999 Elsevier Science S.A.

* cited by examiner

*Primary Examiner* — Phutthiwat Wongwian
*Assistant Examiner* — William Breazeal
(74) *Attorney, Agent, or Firm* — Ernest G. Cusick; Hoffman Warnick LLC

(57) ABSTRACT

Disclosed is a turbulated arrangement of thermoelectric elements for utilizing waste heat generated from a turbine engine. The turbulated arrangement of thermoelectric elements is located within the turbine casing at a heat exhaust end of the turbine engine. The turbulated arrangement of thermoelectric elements convert heat exhaust generated from the turbine engine into electrical energy. In one embodiment, the electrical energy generated from the turbulated arrangement of thermoelectric elements can be used to power electrical components located about the turbine engine.

20 Claims, 2 Drawing Sheets

TURBULATED ARRANGEMENT OF THERMOELECTRIC ELEMENTS FOR UTILIZING WASTE HEAT GENERATED FROM TURBINE ENGINE

BACKGROUND OF THE INVENTION

The present invention relates generally to turbine engines and more particularly to using a turbulated arrangement of thermoelectric elements for utilizing waste heat generated from a turbine engine.

In order to address the challenges of rising fuel costs and the increased demand for more efficient, environmentally-friendly power systems and industrial plants, waste heat recovery technology has been developed that converts waste heat from exhaust streams generated from gas turbines into usable electricity. A thermoelectric module formed from thermoelectric elements is one approach that has been used to produce electricity from waste heat generated from turbine engines. However, most thermoelectric module approaches have relatively low conversion efficiency. Consequently, these types of thermoelectric modules have had limited applications in electrical power generation.

BRIEF DESCRIPTION OF THE INVENTION

In one embodiment of the present invention, there is a system that comprises a turbine engine and a thermoelectric module. In this embodiment, the turbine engine burns fuel and generates heat exhaust. The thermoelectric module is located within the turbine engine and converts the heat exhaust generated from the turbine engine into electrical energy. The thermoelectric module comprises a turbulated arrangement of a plurality of thermoelectric elements connected in series and thermally connected in parallel. Each of the plurality of thermoelectric elements comprises a first thermoelectric material and a second thermoelectric material coupled to each other at a hot junction and a cold junction. The cold junction is coated with a thermal barrier that increases conductive resistance at the cold junction thereby lowering temperature at the cold junction. The hot junction and the cold junction are thermally connected in parallel, wherein a temperature gradient develops between the hot junction and the cold junction. The generated electric energy is a function of the temperature gradient developed between the hot junction and the cold junction.

In another embodiment of the present invention, a turbine engine is provided. In this embodiment of the present invention, the turbine engine comprises a compressor; a combustor that receives a mixture of air from the compressor and fuel for combustion thereof; and a turbine that expands hot gas generated from the combustion of the air and fuel from the compressor for conversion to mechanical rotational energy. The turbine engine further includes a thermoelectric module that converts heat exhaust generated from the turbine into thermoelectrical energy. The thermoelectric module comprises a turbulated arrangement of a plurality of thermoelectric elements located within the casing of the turbine at a heat exhaust end thereof. Each of the plurality of thermoelectric elements comprises a first thermoelectric material and a second thermoelectric material coupled to each other at a hot junction and a cold junction. The cold junction is coated with a thermal barrier that increases conductive resistance at the cold junction, thereby lowering temperature at the cold junction. A temperature gradient develops between the hot junction and the cold junction, wherein the generated thermoelectrical energy is a function of the temperature gradient developed between the hot junction and the cold junction.

In a third embodiment of the present invention, a gas turbine engine is provided. In this embodiment of the present invention, the gas turbine engine comprises a plurality of electrical components; a compressor; a combustor that receives a mixture of air from the compressor and fuel for combustion thereof; and a turbine that expands hot gas generated from the combustion of the air and fuel from the compressor for conversion to mechanical rotational energy. The gas turbine engine further comprises a thermoelectric module that converts heat exhaust generated from the turbine engine into thermoelectrical energy. The thermoelectric module comprises a turbulated arrangement of a plurality of thermoelectric elements located within the casing of the turbine engine at a heat exhaust end of the turbine engine. Each of the plurality of thermoelectric elements comprises a first thermoelectric material and a second thermoelectric material coupled to each other at a hot junction and a cold junction. The cold junction is coated with a thermal barrier that increases conductive resistance at the cold junction, thereby lowering temperature at the cold junction. A temperature gradient develops between the hot junction and the cold junction, wherein the generated thermoelectrical energy is a function of the temperature gradient developed between the hot junction and the cold junction. The thermoelectric module uses the thermoelectrical energy to power the plurality of electrical components.

DETAILED DESCRIPTION OF THE INVENTION

Figure 1:
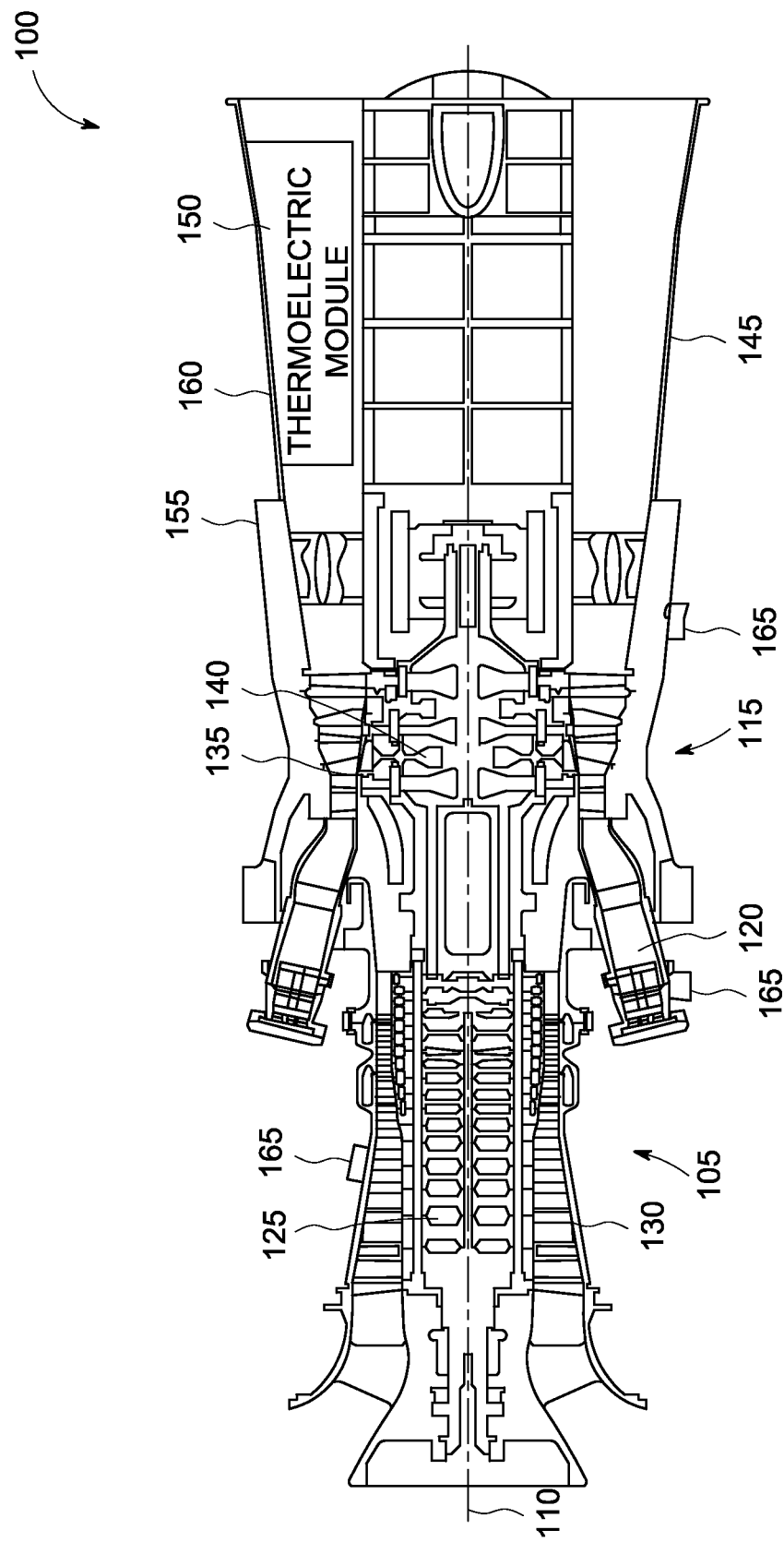
FIG. 1 is an illustration of a gas turbine engine that employs a thermoelectric module having a turbulated arrangement of thermoelectric elements according to one embodiment of the present invention.

Referring to the drawings, FIG. 1 is a schematic illustration of a gas turbine engine 100 in which a thermoelectric module 150 according to one embodiment of the present invention may be used. It will be understood by those skilled in the art that embodiments of the present invention are not limited to use with a gas turbine engine. Embodiments of the present invention may be used with gas turbine engines, such as engines used in power generation and airplanes, steam turbine engines, and other type of rotary engines and dynamo-electric machines where it is desirable to produce electricity from waste heat generated from a turbine engine.

As illustrated in FIG. 1, gas turbine engine 100 comprises a compressor 105 that is mechanically coupled by a common shaft or rotor 110 to a downstream turbine section or turbine 115, and a combustor 120 positioned between compressor 105 and turbine 115. Combustor 120 receives a mixture of air from compressor 105 and fuel added to the combustor for combustion thereof. Turbine 115 expands hot gas generated from the combustion of the air and fuel from compressor 105 for conversion to mechanical rotational energy.

Compressor 105 may include a plurality of stages. Each stage may include a row of compressor rotor blades 125 followed by a row of compressor stator blades 130. Thus, each stage may include a row of compressor rotor blades 125, which rotate about shaft 110, followed by a row of compressor stator blades 130, which remain stationary during operation. Compressor stator blades 130 generally are circumferentially spaced one from the other and fixed about the axis of rotation. Compressor rotor blades 125 are circumferentially spaced and attached to shaft 110. When shaft 110 rotates during operation, compressor rotor blades 125 rotate about it. As one of ordinary skill in the art will appreciate, compressor rotor blades 125 are configured such that, when spun about shaft 110, they impart kinetic energy to the air or fluid flowing through compressor 105.

As illustrated in FIG. 1, turbine 115 may also include a plurality of stages. Each stage would include a plurality of turbine buckets or turbine rotor blades 135, which rotate about shaft 110 during operation, and a plurality of nozzles or turbine stator blades 140, which remain stationary during operation. Turbine stator blades 140 are generally circumferentially spaced one from the other and fixed about the axis of rotation. Turbine rotor blades 135 may be mounted on a turbine wheel (not shown) for rotation about shaft 110. It will be appreciated that the turbine stator blades 140 and turbine rotor blades 135 lie in the hot gas path of turbine 115.

In use, the rotation of compressor rotor blades 125 within compressor 105 may compress a flow of air obtained from an air source (e.g., ambient air). In combustor 120, energy may be released when the compressed air is mixed with a fuel obtained from a fuel source and ignited. The resulting flow of hot gases from combustor 120, which may be referred to as the working fluid, is then directed over turbine rotor blades 135. The flow of working fluid induces the rotation of turbine rotor blades 135 about shaft 110. The energy of the flow of working fluid is transformed into the mechanical energy of the rotating blades. Consequently, shaft 110 rotates because of the connection between the rotor blades and the shaft. The mechanical energy of shaft 110 may then be used to drive the rotation of compressor rotor blades 130, such that the necessary supply of compressed air is produced. Also, in one embodiment, the mechanical energy of shaft 110 may be used by a generator (not shown) to produce electricity.

As shown in FIG. 1, gas turbine engine 100 includes a heat exhaust end 145 that receives heat exhaust generated from turbine 115. Thermoelectric module 150 is located within turbine 115. In one embodiment, thermoelectric module 150 may be located within turbine casing 155 at heat exhaust end 145 on a heat exhaust end casing 160. Thermoelectric module 150 converts heat exhaust generated from the turbine engine into thermoelectrical energy. Details of thermoelectric module 150 and its operation are presented below and discussed with respect to FIG. 2. In one embodiment of the present invention, the thermoelectrical energy generated from thermoelectric module 150 may be used to power a plurality of electrical components 165 located about gas turbine engine 100. In one embodiment, the plurality of electrical components may include sensors (e.g., wired and wireless sensors) or peripheral equipment to the turbine. Using thermoelectric module 150 to power sensors (e.g., wired and wireless sensors) or peripheral equipment to turbine 115 makes these systems stand alone systems and much more attractive as add-ons or upgrades to the turbine, because they are no longer parasitic. FIG. 1 shows only three electrical components (one in compressor 105, turbine 115 and combustor 120), however, those skilled in the art will recognize that there may be additional components and that embodiments of the present invention should not be limited to any particular number. Moreover, those skilled in the art will recognize that thermoelectrical energy generated from thermoelectric module 150 can be applied to other components that are located remote from gas turbine engine 100. In another embodiment, thermoelectrical energy generated from thermoelectric module 150 can be used to augment power generated from gas turbine engine 100.

Figure 2:
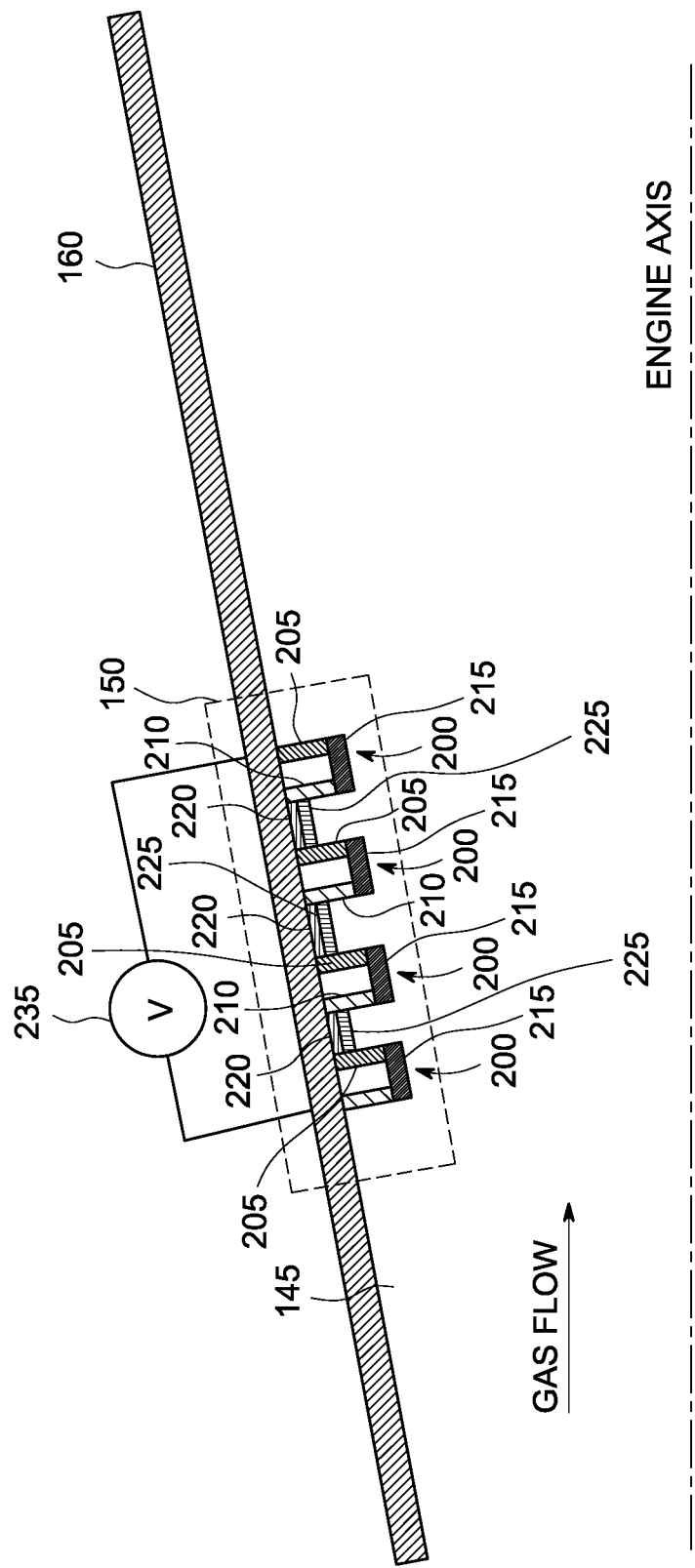
FIG. 2 is a more detailed view of the turbulated arrangement of the thermoelectric elements of the thermoelectric module shown in FIG. 1 with respect to the casing of the turbine engine at the heat exhaust end according to one embodiment of the present invention.

FIG. 2 illustrates a more detailed view of thermoelectric module 150 in relation to heat exhaust end casing 160. As shown, in FIG. 2, thermoelectric module 150 comprises a turbulated arrangement of thermoelectric elements 200 located within the casing of the turbine engine at heat exhaust end casing 160. Thermoelectric elements 200 are electrically connected in series and thermally connected in parallel. Each of thermoelectric elements 200 comprises a first thermoelectric material 205 and a second thermoelectric material 210 coupled to each other at a hot junction 215 and a cold junction 220. Cold junction 220 is coated with a thermal barrier 225 that increases conductive resistance at the cold junction, thereby lowering temperature at the cold junction. In one embodiment, first thermoelectric material 205 may be an N-type semiconductor material, while second thermoelectric material 210 may be a P-type semiconductor material. An illustrative, but non-limiting example of an N-type and P-type semiconductor material that may be used in thermoelectric module 150 includes bismuth telluride, which is a good conductor of electricity, but a poor conductor of heat. Other examples may include silicon germanium and cadmium telluride. Thermal barrier 225 may be any type of insulator material that can increase the conductive resistance at cold junction 220. Illustrative, but non-limiting examples of thermal barrier materials that are suitable for use with thermoelectric module 150 include a thermal barrier coating, a polycarbonate tape or a ceramic tape. An illustrative example of a thermal barrier coating that may be used in an embodiment of the present invention is Yttria stabilized zirconia (9.5% $Y_2O_3$-5.2% $Gd_2O_3$-5.6% $Yb_2O_3$ Balance $ZrO_2$). Commercially available polycarbonate tape or ceramic tape made of alumina is one example of a polycarbonate tape or a ceramic tape that may be used in an embodiment of the present invention.

In operation, as the gas flow of the heat exhaust moves through heat exhaust end 145, a temperature gradient develops between hot junction 215 and cold junction 220. Thermoelectric module 150 uses the temperature gradient to generate a thermoelectric voltage 235. Generation of the thermoelectric voltage 235 by thermoelectric module 150 is based on the Seebeck effect, which states that if two wires of different materials (such as copper and iron) are joined at their ends, forming two junctions, and one junction is held at a higher temperature than the other junction, a voltage difference will arise between the two junctions.

The turbulated arrangement of thermoelectric elements 200 enable thermoelectric module 150 to function (i.e., to obtain a sufficient temperature gradient to generate a thermoelectric voltage that produces thermoelectric energy for intended purposes (e.g., to power electrical equipment, augmenting power supply)) within the turbine casing on heat exhaust casing 160, as opposed to being placed outside of the gas turbine engine. In addition, the turbulated arrangement of thermoelectric elements 200 enable thermoelectric module 150 to function without the use of a cooling module to obtain the necessary temperature gradient sufficient to generate an adequate amount of thermoelectric voltage to enable thermoelectric module 150 to perform its desired function (e.g., power electrical equipment, augmenting power supply). Thus, the additional energy associated with using a cooling pump is obviated. Furthermore, the turbulated arrangement of thermoelectric elements 200 is well suited to enable maximum utilization of heat energy from the exhaust gases. This is attributed to the high heat transfer coefficients associated with turbulators.

In operation, the turbulated arrangement of each of thermoelectric elements 200 produce a turbulated flow of the heat exhaust. The turbulated flow of hot heat exhaust gases produce high local heat transfer coefficients at hot junction 215. Though the local heat transfer coefficient will be lower at cold junction 220, the average heat transfer coefficient will still be sufficiently high, thus increasing the temperature at cold junction 220. To eliminate this, a conductive resistance (i.e., thermal barrier 225) is placed atop cold junction 220 to inhibit heat input at the cold junction. This allows a temperature gradient to develop between hot junction 215 and cold junction 220 (i.e., the thermal difference between the heat input at the hot junction and the heat input at the cold junction). The turbulated arrangement of thermoelectric elements 200 can then function as a self-functioning unit, without the need of external cooling as stated above.

Other parameters associated with thermoelectric elements 200 such as length, thickness and spacing from other elements will affect the temperature gradient. Those skilled in the art will readily appreciate how to refine these parameters in order to obtain a maximized thermoelectric voltage (the higher the temperature gradient, the greater the thermoelectric voltage produced). Thermoelectric module 150 uses the thermal difference to generate thermoelectric voltage 235. Those skilled in the art will recognize that other turbulated arrangement patterns can be used for thermoelectric elements 200, as opposed to the pattern shown in FIG. 2. Non-limiting examples of turbulated arrangements may encompass "stack", "track" and "zig-zag" configurations.

It is believed that the use of thermoelectric module 150 to generate electric energy will help turbine engines add more power to the grid. For example, the average hot gas temperature from a gas turbine is approximately about 1000 degrees Fahrenheit (F) (about 538 degrees Celsius (C)). If a temperature difference of about 200 to about 300 degrees F. (about 93 to about 149 degrees C.) is attained with thermoelectric module 150, then the efficiency of thermoelectric module 150 will range from about 20% to about 30%, and the power output can be in the range of few hundred volts. This is sufficient to help in lighting the unit area, if the obtained power output from the thermoelectric module is a few volts. This gives a low-cost power generation option with very minimal capital cost associated therewith. Furthermore, it is believed for a turbine engine operating in a simple cycle mode that the utilization of heat waste energy can provide a benefit in terms of increased overall efficiency.

While the disclosure has been particularly shown and described in conjunction with a preferred embodiment thereof, it will be appreciated that variations and modifications will occur to those skilled in the art. Therefore, it is to be understood that the appended claims are intended to cover all such modifications and changes as fall within the true spirit of the disclosure.

What is claimed is:

1. A system, comprising:
a turbine engine that burns fuel and generates heat exhaust;
a thermoelectric module, located within a heat exhaust end of the turbine engine, that converts the heat exhaust generated from the turbine engine into electrical energy, the thermoelectric module comprising a turbulated arrangement of a plurality of thermoelectric elements electrically connected in series and thermally connected in parallel, each of the plurality of thermoelectric elements comprising a first thermoelectric material and a second thermoelectric material coupled to each other at a hot junction and a cold junction, the cold junction coated with a thermal barrier that increases conductive resistance at the cold junction thereby lowering temperature at the cold junction, the hot junction and the cold junction being thermally connected in parallel, wherein a temperature gradient develops between the hot junction and the cold junction, wherein the generated electric energy is a function of the temperature gradient developed between the hot junction and the cold junction, wherein each of the plurality of thermoelectric elements in the turbulated arrangement protrudes from the heat exhaust end into a gas flow associated with the heat exhaust passing through the heat exhaust end, the plurality of thermoelectric elements protruding from the heat exhaust end into the gas flow passing through the heat exhaust end creating a turbulated flow of the gas flow, the turbulated gas flow producing a higher heat transfer coefficient at each hot junction of the plurality of thermoelectric elements and a lower heat transfer coefficient at each cold junction of the thermoelectric elements, enhancing the temperature gradient between each of the hot junctions and cold junctions of the plurality of thermoelectric elements.

2. The system according to claim 1, wherein the thermoelectric module is located on a wall in a casing of the turbine engine.

3. The system according to claim 2, wherein the thermoelectric module is located on a wall at the heat exhaust end of the turbine engine.

4. The system according to claim 1, further comprising a plurality of electrical components located about the turbine engine.

5. The system according to claim 4, wherein the electrical energy generated from the thermoelectric module is used to power the plurality of electrical components.

6. The system according to claim 1, wherein the turbulated arrangement of the plurality of thermoelectric elements maximizes utilization of heat energy generated from the heat exhaust.

7. The system according to claim 1, wherein the difference between heat input at each hot junction and heat input associated with each cold junction coated with the thermal barrier corresponds to a thermal difference that results in the temperature gradient that develops between the hot junction and the cold junction.

8. The system according to claim 7, wherein the thermoelectric module uses the thermal difference to generate a thermoelectric voltage.

9. A turbine engine, comprising:
a compressor;
a combustor that receives a mixture of air from the compressor and fuel for combustion thereof;
a turbine that expands hot gas generated from the combustion of the air and fuel from the compressor for conversion to mechanical rotational energy; and
a thermoelectric module that converts heat exhaust generated from the turbine into thermoelectrical energy, the thermoelectric module comprising a turbulated arrangement of a plurality of thermoelectric elements located within the casing of the turbine at a heat exhaust end thereof, each of the plurality of thermoelectric elements comprising a first thermoelectric material and a second thermoelectric material coupled to each other at a hot junction and a cold junction, the cold junction coated with a thermal barrier that increases conductive resistance at the cold junction thereby lowering temperature at the cold junction, wherein a temperature gradient develops between the hot junction and the cold junction, wherein the generated thermoelectrical energy is a function of the temperature gradient developed between the hot junction and the cold junction, wherein each of the plurality of thermoelectric elements in the turbulated arrangement protrudes from the heat exhaust end into a gas flow associated with the heat exhaust passing through the heat exhaust end, the plurality of thermoelectric elements protruding from the heat exhaust end into the gas flow passing through the heat exhaust end creating a turbulated flow of the gas flow, the turbulated gas flow producing a higher heat transfer coefficient at each hot junction of the plurality of thermoelectric elements and a lower heat transfer coefficient at each cold junction of the thermoelectric elements, enhancing the temperature gradient between each of the hot junctions and cold junctions of the plurality of thermoelectric elements.

10. The turbine engine according to claim 9, wherein the thermoelectrical energy is used to power a plurality of electrical components located about the turbine engine.

11. The turbine engine according to claim 9, wherein the turbulated arrangement of the plurality of thermoelectric elements are connected in series.

12. The turbine engine according to claim 11, wherein the hot junction and the cold junction of each of the plurality of thermoelectric elements are thermally connected in parallel.

13. The turbine engine according to claim 9, wherein the turbulated gas flow of the heat exhaust ensures that a high average heat transfer coefficient is generated to enable maximum heat capture from hot gases of the heat exhaust while the cold junction coated with the thermal barrier reduces the cold junction temperature.

14. The turbine engine according to claim 9, wherein a difference between heat input of each hot junction and heat input associated with each cold junction coated with the thermal barrier corresponds to a thermal difference that results in the temperature gradient that develops between the hot junction and the cold junction.

15. The turbine engine according to claim 14, wherein the thermoelectric module uses the thermal difference to generate a thermoelectric voltage.

16. A gas turbine engine, comprising:
a plurality of electrical components;
a compressor;
a combustor that receives a mixture of air from the compressor and fuel for combustion thereof;
a turbine that expands hot gas generated from the combustion of the air and fuel from the compressor for conversion to mechanical rotational energy; and
a thermoelectric module that converts heat exhaust generated from the turbine into thermoelectrical energy, the thermoelectric module comprising a turbulated arrangement of a plurality of thermoelectric elements located within the casing of the turbine at a heat exhaust end, each of the plurality of thermoelectric elements comprising a first thermoelectric material and a second thermoelectric material coupled to each other at a hot junction and a cold junction, the cold junction coated with a thermal barrier that increases conductive resistance at the cold junction thereby lowering temperature at the cold junction, wherein a temperature gradient develops between the hot junction and the cold junction, wherein the generated thermoelectrical energy is a function of the temperature gradient developed between the hot junction and the cold junction, wherein the thermoelectric module uses the thermoelectrical energy to power the plurality of electrical components, and wherein each of the plurality of thermoelectric elements in the turbulated arrangement protrudes from the heat exhaust end into a gas flow associated with the heat exhaust passing through the heat exhaust end, the plurality of thermoelectric elements protruding from the heat exhaust end into the gas flow passing through the heat exhaust end creating a turbulated flow of the gas flow, the turbulated gas flow producing a higher heat transfer coefficient at each hot junction of the plurality of thermoelectric elements and a lower heat transfer coefficient at each cold junction of the thermoelectric elements, enhancing the temperature gradient between each of the hot junctions and cold junctions of the plurality of thermoelectric elements.

17. The gas turbine engine according to claim 16, wherein the turbulated arrangement of the plurality of thermoelectric elements are connected in series.

18. The gas turbine engine according to claim 17, wherein the hot junction and the cold junction of each of the plurality of thermoelectric elements are thermally connected in parallel.

19. The gas turbine engine according to claim 16, wherein the turbulated gas flow of the heat exhaust ensures that a high average heat transfer coefficient is generated to enable maximum heat capture from hot gases of the heat exhaust while the cold junction coated with the thermal barrier reduces the cold junction temperature.

20. The gas turbine engine according to claim 16, wherein a difference between heat input of each hot junction and heat input associated with the cold junction coated with the thermal barrier corresponds to a thermal difference that results in the temperature gradient that develops between the hot junction and the cold junction, wherein the thermoelectric module uses the thermal difference to generate a thermoelectric voltage.

* * * * *